United States Patent
Baran et al.

(10) Patent No.: US 6,324,057 B1
(45) Date of Patent: Nov. 27, 2001

(54) TERMINAL BLOCK SUPPORTED PRINTED CIRCUIT CARDS FOR COMPACT PROGRAMMABLE LOGIC CONTROLLER

(75) Inventors: Michael S. Baran, Elm Grove; Shawn D. Cloran, Wauwatosa, both of WI (US)

(73) Assignee: Rockwell Automation Technologies, Inc., Mayfield Heights, OH (US)

(*) Notice: Subject to any disclaimer, the term of this patent is extended or adjusted under 35 U.S.C. 154(b) by 0 days.

(21) Appl. No.: 09/637,051

(22) Filed: Aug. 11, 2000

Related U.S. Application Data
(60) Provisional application No. 60/169,421, filed on Dec. 7, 1999.

(51) Int. Cl.[7] ........................................ H05K 7/20
(52) U.S. Cl. ............... 361/690; 361/679; 361/683; 361/692; 361/704; 361/721; 361/785; 361/790; 361/796; 174/16.1; 174/17 VA; 439/629; 439/630

(58) Field of Search ................................ 361/600, 601, 361/672, 679, 687–690, 704, 720, 721, 784, 785, 790, 823; 174/16.1, 52.1, 59, 60, 17 VA; 165/185, 104.33; 439/629–631

(56) References Cited

U.S. PATENT DOCUMENTS

| | | | |
|---|---|---|---|
| 4,027,206 | * | 5/1977 | Lee ................................. 361/697 |
| 6,028,770 | * | 2/2000 | Kerner et al. ................... 361/704 |
| 6,091,604 | * | 7/2000 | Plougsgaard et al. ........... 361/707 |

* cited by examiner

Primary Examiner—Leo P. Picard
Assistant Examiner—Davis L. Chervinsky
(74) Attorney, Agent, or Firm—Steven J. Wietrzny; Alexander M. Gerasimow; William R. Walbrun

(57) ABSTRACT

A compact programmable logic controller provides a floating mounting of circuit cards carried by opposed terminal blocks of the industrial controller the latter only which are directly mounted to the housing. Positioning of the cards between opposed connector blocks prevents torsion on the cards resulting from unbalanced forces on the terminal blocks and provides an extremely rigid structure.

14 Claims, 4 Drawing Sheets

TERMINAL BLOCK SUPPORTED PRINTED CIRCUIT CARDS FOR COMPACT PROGRAMMABLE LOGIC CONTROLLER

CROSS-REFERENCE TO RELATED APPLICATIONS

This application hereby claims the benefit of provisional application 60/169,421, filed Dec. 7, 1999.

STATEMENT REGARDING FEDERALLY SPONSORED RESEARCH OR DEVELOPMENT

BACKGROUND OF THE INVENTION

The present invention relates to industrial controllers used for the control of industrial processes and machines, and in particular to a rugged assembly method for compact industrial controllers.

Industrial controllers are special purpose computers used for controlling industrial processes and manufacturing equipment on a real-time basis. Under the direction of a stored program, a processor in the industrial controller examines a set of inputs reflecting the status of the controlled process and changes a set of outputs controlling the industrial process. The inputs and outputs may be binary, that is on or off, or analog, providing a value within a continuous range. Typically analog signals are converted to binary words for processing.

The inputs and outputs are processed by input/output (I/O) circuitry which performs any necessary data type conversion, level shifting, isolation and amplification of the signals to and from the processor so as to be compatible with the signals required by the industrial controller. Processor and I/O circuitry for industrial control are well known in the art.

Compact industrial controllers may be produced in which the processor and the necessary I/O circuits are in a single housing. It is desirable that the base of the housing, defining its footprint when attached to the back of a cabinet, be small to conserve cabinet space. This small footprint may be accommodated by dividing the internal circuitry of the controller into multiple circuit cards stacked one on top of another.

Interconnections between the circuit cards may be accommodated by conductive connectors typically having gold plated pins necessary to communicate the low voltage logic level signals used by the processor. The multiple cards must be rigidly mounted so that vibration to be expected in the industrial environment does not cause abrasion of the gold plating layer.

In addition to holding the processor and I/O circuits, such a compact industrial controller must support terminal blocks or the like providing a means to connect the signals of the controlled equipment to the I/O circuitry. Two sets of terminal blocks separated across the front of the housing may be provided, one for input signals and one for output signals. The terminal blocks may also provide connections for line power in, user power out, and other signals known in the art.

Normally the terminal blocks will be attached directly to the circuit card holding the I/O circuitry by mechanically rigid conductors being continuations of the stampings which form part of the connector block. Forces involved in making the connections to the terminal blocks using a screwdriver or the like, therefore can be transmitted through these terminal blocks to the I/O circuit card. Unless the terminal blocks are firmly mounted, movement of the terminal blocks under such forces can cause distortion of the attached circuit card and possible damage to its printed circuitry or components.

Precise, rigid and strong mountings of each of the circuit cards and the terminal blocks against the housing are extremely difficult to achieve. "Stack-up" of tolerances between the molded components of the housing and terminal blocks prevent designs requiring close fits between each of these parts and the circuit cards.

BRIEF SUMMARY OF THE INVENTION

The present invention recognizes a hierarchy of positional relationships between the various components of the industrial controller. At the root of the hierarchy are the terminal blocks which must be solidly affixed against the housing to resist the forces incident to attachment of wires to the terminal blocks. The two terminal blocks must in turn be fixed with respect to each other and the I/O circuit card so as to prevent stresses in the I/O circuit card caused by relative movement of any of these three elements. Further, the two circuit cards must be held rigidly with respect to each other to prevent wear on their electrical interconnections. Importantly, however, there need be no direct connection between the circuit cards and the housing.

The invention therefore contemplates a "floating" mounting of the circuit cards attached to the terminal blocks and not to the housing. Rigidity is provided by the circuit cards themselves which interconnect the terminal blocks in a box-like structure. The restraint on the terminal blocks provided by their contact with the housing, channels any forces transmitted to the box-like structure into tension and compression of the circuit cards along their planes, a mode in which they are extremely strong.

Specifically, the present invention provides an industrial controller that has a housing with walls extending upward from the base and a first and second circuit card positioned within the housing. First and second terminal blocks having upper faces exposed at the upper edges of the opposite walls of the housing reveal terminal blocks for the attachment of input and output lines and hold the first and second circuit cards spaced apart, therebetween by first attachments and without requiring substantial restraining contact between the circuit cards and the housing.

Thus it is one object of the invention to provide a floating support of the circuit cards with respect to the housing eliminating the need for precise housing tolerances or stresses caused by movement of the circuit cards with respect to the housing.

The first and second terminal blocks may provide for downwardly extending legs attached to opposing edges of the upper surface of a first of the circuit cards. The second circuit card may be positioned within the housing above the first circuit card and between the terminal blocks. The first and second terminal blocks may further include at outer edges of the first and second terminal blocks, attachments to the upper edges of opposing walls of the housing. At inner portions of the first and second terminal blocks, attachments may be made to opposing edges of the process circuit card.

Thus it is another object of the invention to provide a mounting of circuit cards on the terminal blocks such as forms a rigid structure resisting torsional motion between the terminal blocks and the I/O circuit card. Downward or upward forces on the terminal blocks of the first and second terminal blocks are converted into edgewise-tensile/compressive forces on the second circuit card, a direction in which the second circuit card is extremely strong.

The industrial controller may further include a housing cover attachable to the upper edges of the upwardly extending walls of the housing and restrained from downward movement by the upwardly extending walls. The housing cover may include attachments engaging inner portions of the first and second terminal blocks.

Thus it is another object of the invention to convert downward forces on the terminal blocks such as might produce torsional movement with respect to the I/O card into downward compressive forces on the upwardly extending housing walls through the housing cover.

At least one of the first and second terminal blocks may include an upwardly exposed conductive ledge positioned above the I/O circuit card and attached via the downwardly extending legs to a receiving ground conductor of the I/O circuit card whereby the lower surface of the second circuit card may be received above the upper surface of the conductive ledge to establish a ground connection between the second circuit card and the I/O circuit card.

Thus it is another object of the invention to provide a low impedance ground connection between the two circuit cards as may be realized by the relatively robust conductors of the terminal blocks.

The housing may include a plurality of ventilation slots in the upstanding walls and the legs may provide for the passage of air from the ventilation slots between the terminal blocks and the I/O circuit card.

Thus it is another object of the invention to promote cooling airflow by removing the terminal blocks from the surface of the I/O circuit card such as may be done without undue torsion between these two members through the bracing system of the present invention.

The housing may include attachments attaching edges of the I/O card to the housing.

Thus it is another object of the invention to provide for a supplemental restraining of the I/O circuit card as may be useful during assembly, but which is loose enough not to promote stresses with motion of the terminal blocks to which the I/O card is attached.

The foregoing and other objects and advantages of the invention will appear from the following description. In the description, reference is made to the accompanying drawings which form a part hereof and in which there is shown by way of illustration a preferred embodiment of the invention. Such embodiment does not necessarily represent the full scope of the invention, however, and reference must be made to the claims herein for interpreting the scope of the invention.

DETAILED DESCRIPTION OF THE INVENTION

Figure 1:
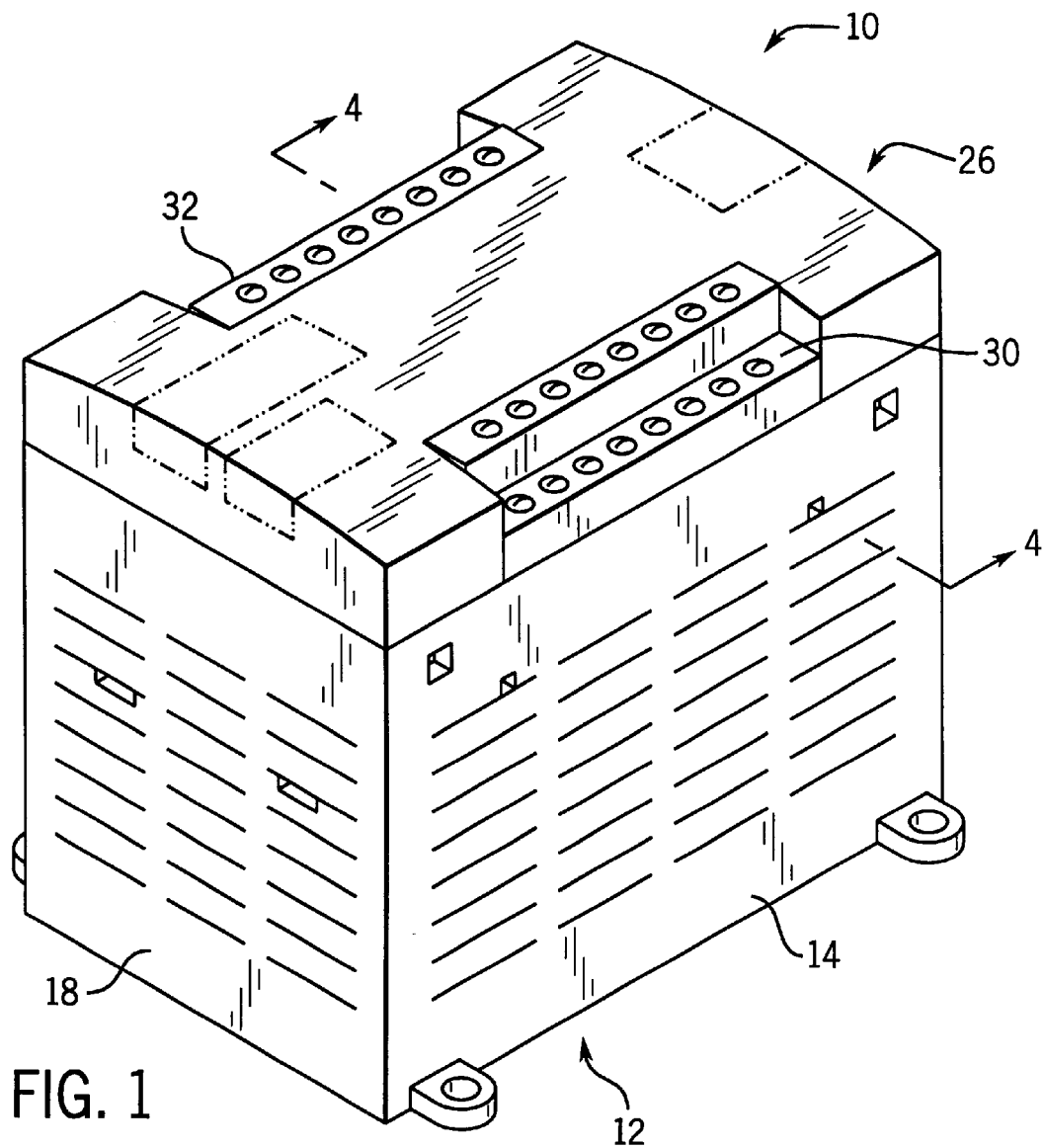
FIG. 1 is a perspective view of the assembled compact industrial controller of the present invention.
Figure 2:
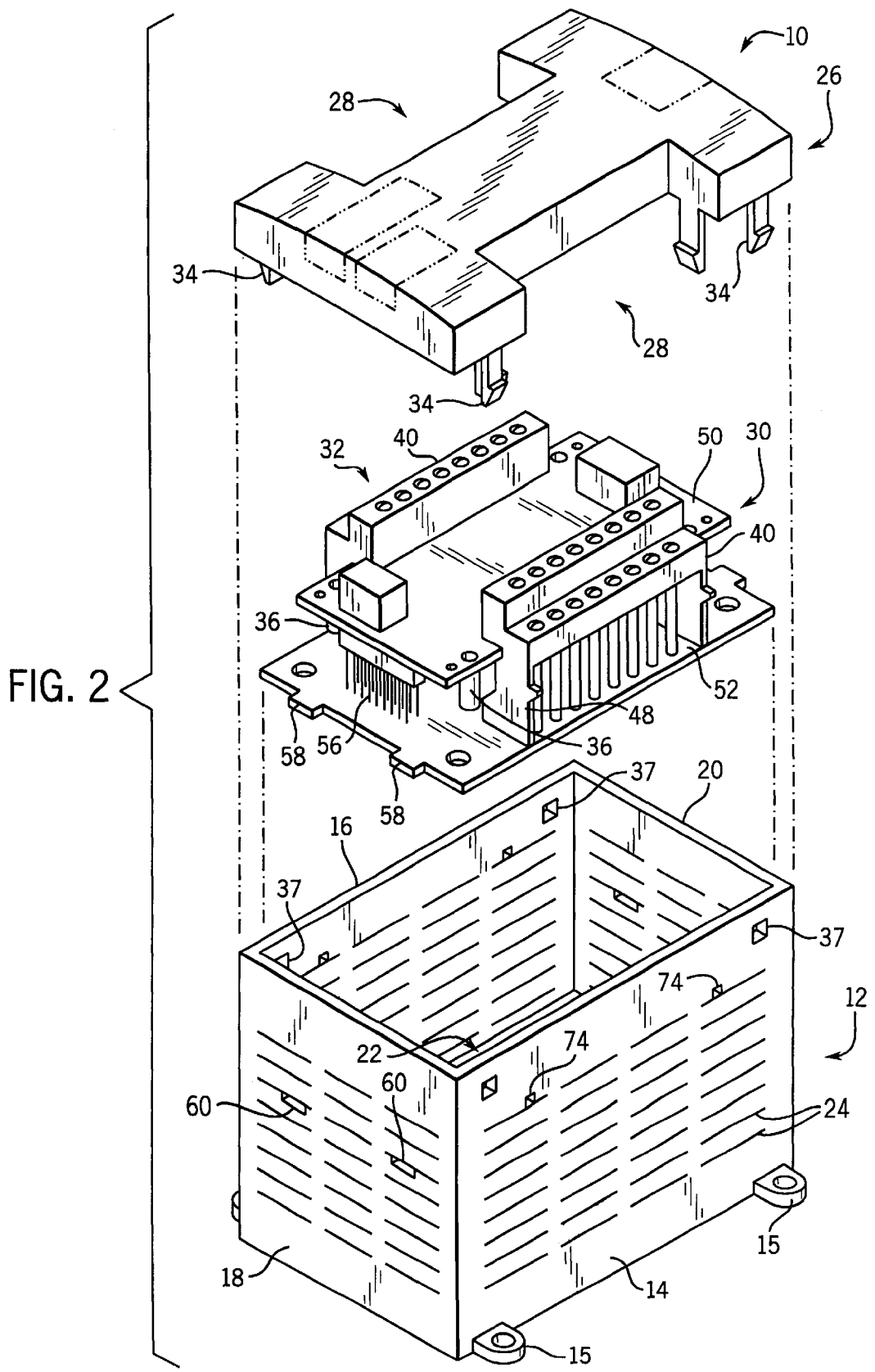
FIG. 2 is an exploded perspective view similar to that of FIG. 1 showing the housing, cover, and assembled processor and I/O cards held by terminal blocks.

Referring now to FIGS. 1 and 2, an industrial controller 10 of the present invention provides an outer, box-shaped housing 12 having upstanding sidewalls 14 and 16 and upstanding end walls 18 and 20 attached at their lower edge about the periphery of a rectangular base 22. Directions of up and down in the following description will be with reference to the base and the sidewalls. However, it will be understood that the invention is not limited by any particular orientation of the controller 10.

Sidewalls 14 and 16 are perforated by a number of ventilation slots 24 that allow convective flow of air through the housing volume when the housing 12 is mounted against a vertical panel with sidewalls 14 and 16 vertically opposed. The housing 12 may be attached to the panel via attachment ears 15.

A housing cover 26 fits against upper edges of the walls 14 through 20 and includes opposed cutouts 28 positioned, respectively, over the sidewalls 14 and 16. The cutouts 28 expose terminal blocks 30 and 32 which present on their upper surfaces, screw terminals 42 to which input and output lines for the industrial controller 10 may be attached.

The housing cover 26 is retained against the upper edges of the wall 14 through 20 by downwardly extending flexible hooks 34 in each of the corners of the cover 26 engaging in corresponding slots 37 in the sidewalls 14 and 16. The cover 26, when so placed against the housing 12, engages with a circuit card resting on cantilevered bosses 36 to be described below on the terminal blocks 30 and 32 to restrict access by the user only to functions and components relevant to the end user when the controller 10 is fully assembled.

Figure 3:
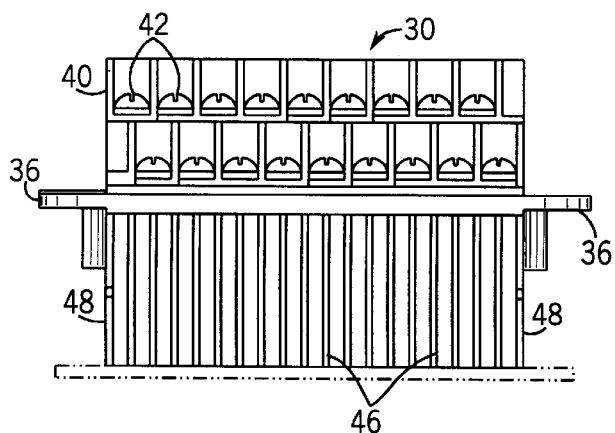
FIG. 3 is a side elevational view of the terminal blocks of FIG. 2 removed from the circuit cards.

Referring now to FIG. 3, the terminal blocks 30 and 32 include an upper insulating barrier portion 40 providing insulating walls between the screw terminals 42. The barrier portion 40 may support two rows of screw terminals 42 in a stepped-tier arrangement well known in the art. Each screw terminal 42 communicates with a stilt conductor 46 extending downward in unsupported fashion beneath the barrier portion 40. The stilt conductors 46 are staggered horizontally and are stiff and thus transmit forces between the terminal blocks 30 and 32 and the I/O circuit card 52 to which they are attached. While it is possible to isolate these forces through the use of highly flexible connectors, this non-standard design would increase the complexity of assembling the terminal blocks 30 and 32 to the I/O circuit card 52, would have reduced current carrying capacity, and would require a more complex manufacturing process to produce the terminal blocks 30 and 32 which currently allows a relatively high gauge component of the screw terminals 42 to simply be extended to form the stilt conductor 46.

The barrier portion 40 of the screw terminals 30 and 32 also provides, at their ends, downwardly extending insulating legs 48 of lengths substantially equal to the stilt conductor 46. The insulating legs hold sidewardly extending cantilevered bosses 36 as have been mentioned and will be described in more detail below. Insulating legs 48 may also include outwardly extending tabs 72 engaging corresponding slots 74 in sidewalls 14 and 16.

The terminal blocks 30 and 32 are held separated by a processor circuit card 50 and an I/O circuit card 52 oriented in a horizontal plane. The processor circuit card 50 and an I/O circuit card 52, in a preferred embodiment are constructed of epoxy impregnated fiberglass according to techniques well known in the art. The I/O circuit card 52 extends horizontally to receive the lower most ends of the stilt conductors 46 by means of holes in the I/O circuit card 52 where the stilt conductors 46 are secured to printed circuitry by soldering techniques understood in the art. The insulating legs 48 have lowermost pegs (not shown) received by corresponding holes in the I/O circuit card 52 to stabilize them against lateral motion.

Figure 4:
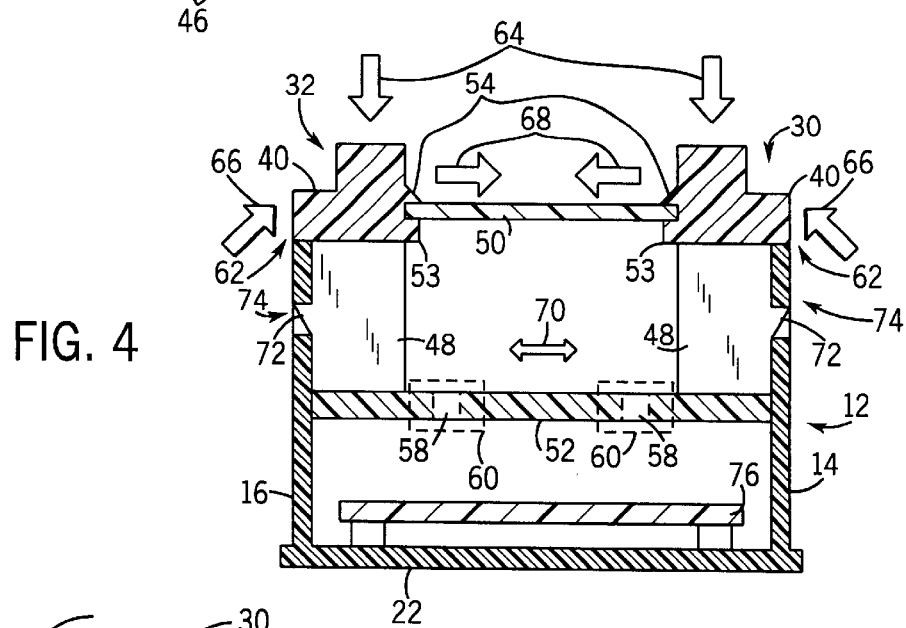
FIG. 4 is a simplified cross-section along lines 4—4 of FIG. 1 showing the floating mounting of the circuit cards on the terminal blocks with respect to housing and the operation of the terminal blocks and housing to convert downward forces on individual terminal blocks into compressive and tensional forces along the planes of the circuit cards.

The processor circuit card 50 is positioned parallel to and above the I/O circuit card 52 to span the inner opposed edges of the barrier portions 40 of the terminal blocks 30 and 32. Referring to FIG. 4 in particular, processor circuit card 50 may rest on inwardly extending ledges 53 formed integrally with the barrier portion 40 of the terminal blocks 32 and 30. Upward motion of the processor circuit card 50 away from ledge 53 is prevented by barbs 54 extending over processor circuit card 50 but displaced outward by slight flexure of the I/O circuit card 52 and the stilt conductors and insulating legs 48 during assembly. The processor circuit card 50 may also be held by screws through corresponding holes in the processor circuit card 50 as received by the bosses 36.

Referring again to FIG. 2, logic level signals may communicate between I/O circuit card 52 and processor circuit card 50 through multi-pin conductor 56 having mating halves, one attached to the upper surface of I/O circuit card 52 and one attached to the lower surface of processor circuit card 50. I/O circuit card 52 may be restrained during assembly by means of tabs 58 extending from edges of the I/O circuit card 52 to be received in loose slots 60 in end walls 18 and 20. Referring to FIG. 4, in a first embodiment, these loose slots 60 provide only a general location of the I/O circuit card 52 and, when the industrial controller 10 is fully assembled, do not provide significant restraining engagement between the housing 12 and I/O circuit card 52 as a result of their relatively large size.

Referring still to FIG. 4, the barrier portion 40 of the terminal blocks 32 and 30, are positioned on the I/O circuit card 52 and flanking processor circuit card 50 so that their outer edges 62 engage upper edges of sidewalls 14 and 16. A downward force 64 on either of terminal blocks 30 and 32 such as may occur when the terminal blocks are being tightened or loosened with a screwdriver will be met with an outer upward force 66 between the insulating barrier portion 40 and the upper edges of sidewalls 14 and 16. Such a force would normally be expected to exert a torque on the terminal blocks 32 and 30 about their long axes such as would bend the I/O circuit card 52. However, this torque is resisted by the presence of the processor circuit card 50 between the barrier portion 40 of terminal blocks 30 and 32 which experiences a compression 68. At the same time, the I/O circuit card 52 attached to the terminal blocks 32 and 30 via the stilt conductors 46 (not shown in FIG. 4) and the insulating legs 48 experiences a tension 70. Processor circuit card 50 and I/O circuit card 52 are relatively strong in tension and compression along their planes as opposed to a bending which may produce breaks in the fine wiring of their printed surfaces. .

Thus it will be understood that processor circuit card 50 and I/O circuit card 52 are attached directly only to the terminal blocks 32 and 30 and as a result of the large tolerances of loose slots 74 and 60 essentially float with respect to the housing 12. Forces on the terminal blocks 30 and 32 causing them to move separately are resisted by the structure formed by the processor circuit card 50 and I/O circuit card 52. For this reason, the processor circuit card 50 and I/O circuit card 52 do not experience bending strains as might be caused by relative movement of the terminal blocks 30 and 32 or forces between the processor circuit card 50 and I/O circuit card 52 the housing 12.

The I/O circuit card 52 is supported above the base 22 to provide room for additional circuit cards, for example, a power supply circuit card 76 such as may be connected to the other circuit cards by a relatively low number of flexible connectors.

In an alternative embodiment, the rigid structure formed by the processor circuit card 50 and I/O circuit card 52 and the terminal blocks 32 and 30 may be attached to the housing 12 through the I/O circuit card 50, for example, by stand-offs to the power supply circuit card 76 or the like, instead of or in addition to the attachment between the terminal blocks 32 and 30 and the housing 12. In these cases the rigidity of the processor circuit card 50 and I/O circuit card 52 and the terminal blocks 32 and 30 is independent of the attachment but may be augmented by it.

Figure 6:
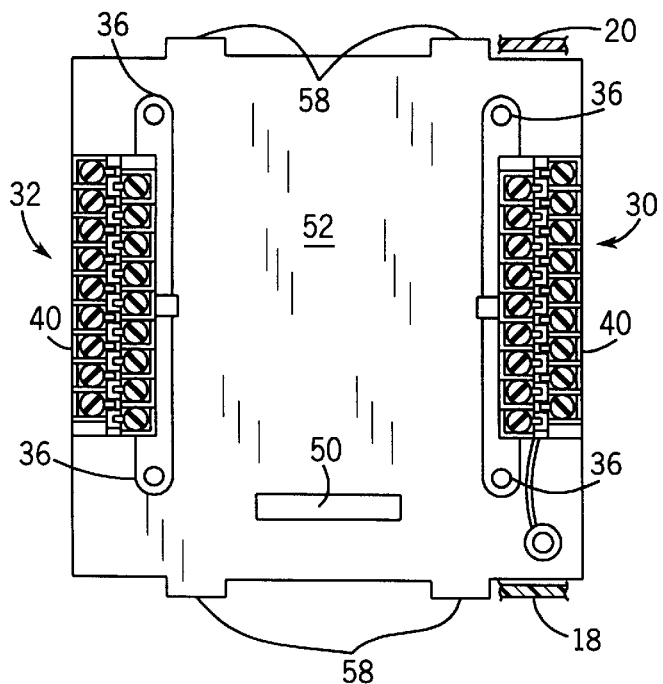
FIG. 6 is a plan view of the I/O card and terminal block assembly of FIG. 2 with the processor card removed to show bosses of the terminal blocks used to hold the processor circuit card.

Referring now to FIG. 6 as mentioned, barrier portion 40 provides for cantilevered bosses 36 extending laterally toward the end walls 18 and 20 and having an upper surface positioned to receive the lower surface of processor circuit card 50 (not shown in FIG. 6). Processor circuit card 50 has corresponding holes matching holes in the bosses 36 so that screws may be used to retain the processor circuit card 50 against the barrier portion 40 for additional security. Other types of fasteners or no fasteners may also be used.

Figure 5:
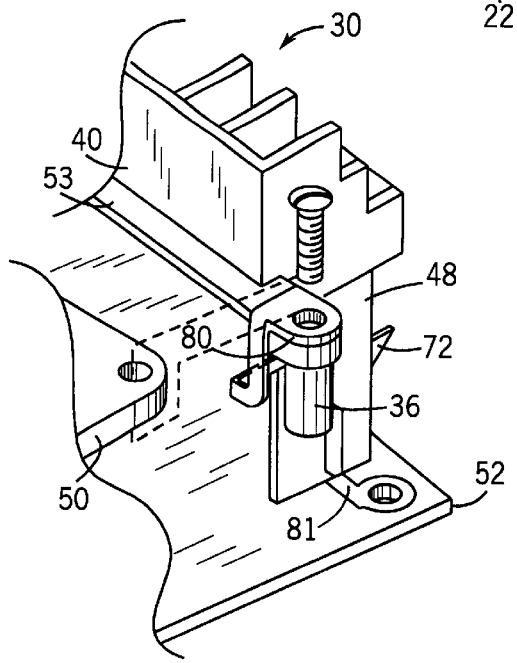
FIG. 5 is a fragmentary perspective detail view of an auxiliary attachment of the processor circuit card to the terminal blocks via a grounding boss to provide ground connections between the circuit cards through the conductors of the terminal block.

Referring now to FIG. 5, one boss 36 may include an overlying conductive ledge or plate 80 extending downward along insulating leg 48 to be received like stilt conductors 46 in a hole of I/O circuit card 52 connected to a ground trace 81. The ground trace 81 provides a solid ground connection through this substantial conductive plate 80 between the two circuit cards 50 and 52.

Figure 7:
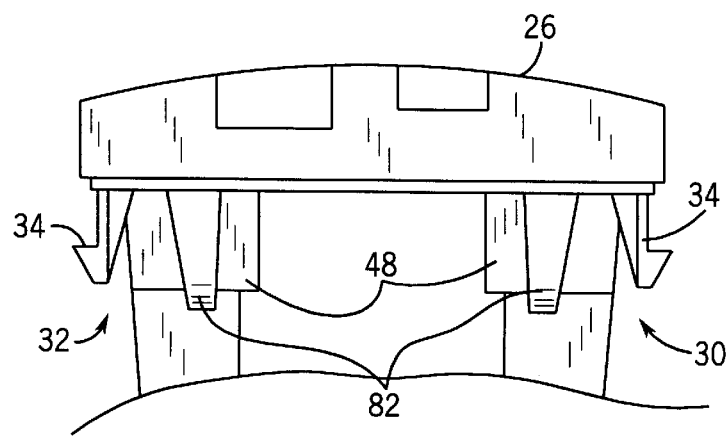
FIG. 7 is a side elevational view of the cover of FIG. 2 showing hooks for engaging the housing and separate hooks for supporting the inner edges of the terminal blocks.
Figure 8:
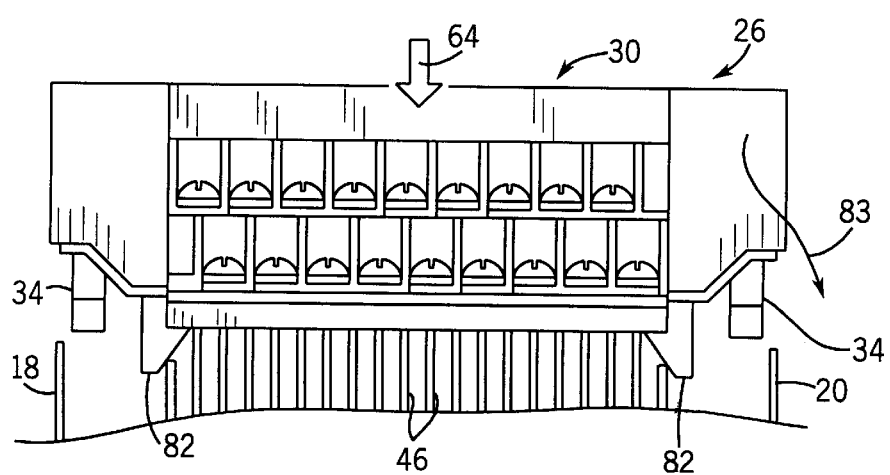
FIG. 8 is a side elevational view of the cover of FIG. 7 showing engagement of the hooks with respect to the terminal blocks for additional support of the terminal blocks.

Referring now to FIGS. 7 and 8, cover hooks 82 extending downward from the cover 26 to engage a lower surface of the barrier portion 40 of terminal blocks 32 and 30 thereby providing a retaining connection to a major structural component of the controller 10 (the terminal blocks) as opposed to latching hooking it just to the housing 12 which has relatively flexible walls.

A marked up version of the above paragraphs is attached hereto.

The above description has been that of a preferred embodiment of the present invention. It will occur to those that practice the art that many modifications may be made without departing from the spirit and scope of the invention. In order to apprise the public of the various embodiments that may fall within the scope of the invention, the following claims are made.

We claim:

1. An industrial controller comprising:
   a housing providing walls extending upward from a base;
   a first circuit card positioned within the housing; first and
      second terminal blocks having upper portions providing terminal blocks for connecting input and output lines, and downwardly extending legs attached to opposing edges of an upper surface of the first circuit card; and a second circuit card positioned within the housing above the first circuit card and between the upper portions of the terminal blocks;

whereby the first and second circuit cards form a structure with the terminal blocks that is rigid independent of attachments to the housing.

2. The industrial controller of claim 1 wherein at least one of the terminal blocks is connected to an upper edge of a housing wall.

3. The industrial controller of claim 2 wherein the first circuit card is connected to the housing.

4. The industrial controller of claim 1 wherein the first circuit card is connected to the housing.

5. An industrial controller comprising:

a housing providing walls extending upward from a base;

a first circuit card positioned within the housing; first and second terminal blocks having upper faces providing terminal blocks for connecting input and output lines, and downwardly extending legs attached to opposing edges of an upper surface of the first circuit card;

a second circuit card positioned within the housing above the first circuit card and between the terminal blocks;

wherein the first and second terminal blocks are connected at outer edges to the upper edges of opposing walls of the housing and at inner portions to opposing edges of the second circuit card.

6. The industrial controller of claim 5 further including a housing cover attachable to the upper edges of the upwardly extending walls of the housing and restrained from downward movement by the upwardly extending walls, the housing cover being connected to inner portions of the first and second terminal blocks.

7. The industrial controller of claim 5 wherein the downwardly extending legs are conductors leading from the terminal blocks to receiving conductors of the first circuit card.

8. The industrial controller of claim 6 wherein at least one of the first and second terminal blocks includes an upwardly exposed conductive ledge positioned above the first circuit card and attached via the downwardly extending legs to a receiving ground conductor of the first circuit card;

whereby the lower surface of the second circuit card may be received against the upper surface of the conductive ledge to establish a ground connection between the second circuit card and the first circuit card.

9. The industrial controller of claim 7 wherein the downwardly extending legs further include nonconductive supports leading from the terminal blocks to the first circuit card.

10. The industrial controller of claim 5 wherein the downwardly extending legs are nonconductive supports leading from the terminal blocks to the first circuit card.

11. The industrial controller of claim 5 wherein the housing includes a plurality of ventilation slots in the upstanding walls and wherein the legs provide for the passage of air from the ventilation slots between the terminal blocks and the first circuit card.

12. The industrial controller of claim 5 wherein the housing is connected to edges of the first circuit card.

13. The industrial controller of claim 11 wherein the first circuit card has tabs received in holes in the housing.

14. The industrial controller of claim 5 wherein the inner portions of the first and second terminal blocks are connected to the second card by a means of fastening passing through holes in the second circuit card to be received by an upwardly exposed boss in the terminal blocks.

* * * * *